US010726928B2

(12) United States Patent
Lin et al.

(10) Patent No.: US 10,726,928 B2
(45) Date of Patent: Jul. 28, 2020

(54) COMPUTATION SPEED COMPENSATION CIRCUIT AND COMPENSATION METHOD THEREOF

(71) Applicant: Winbond Electronics Corp., Taichung (TW)

(72) Inventors: Tay-Jyi Lin, Taichung (TW); Ting-Yu Shyu, Taichung (TW); Chiao-Chuan Huang, Taichung (TW); Jinn-Shyan Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/372,435

(22) Filed: Apr. 2, 2019

(65) Prior Publication Data

US 2019/0348134 A1    Nov. 14, 2019

(30) Foreign Application Priority Data

May 14, 2018 (TW) .............. 107116293 A

(51) Int. Cl.
| | | |
|---|---|---|
| *G11C 7/00* | (2006.01) | |
| *G11C 16/30* | (2006.01) | |
| *G06F 1/3296* | (2019.01) | |
| *G11C 16/12* | (2006.01) | |

(52) U.S. Cl.
CPC ............ *G11C 16/30* (2013.01); *G06F 1/3296* (2013.01); *G11C 16/12* (2013.01)

(58) Field of Classification Search
CPC ....... G11C 5/147; G11C 5/14; G11C 11/4074; G11C 16/30; G11C 5/143

USPC ......................................................... 365/226
See application file for complete search history.

(56) References Cited

U.S. PATENT DOCUMENTS

| | | | |
|---|---|---|---|
| 7,667,497 B2 | 2/2010 | Liang et al. | |
| 8,933,726 B2 | 1/2015 | Wang | |
| 9,628,077 B2 | 4/2017 | Xie et al. | |
| 9,755,620 B1 | 9/2017 | Lin et al. | |
| 2013/0328401 A1* | 12/2013 | Chen ...................... | H02J 9/00 307/64 |

FOREIGN PATENT DOCUMENTS

| | | |
|---|---|---|
| TW | 319846 | 11/1997 |
| TW | 201246214 | 11/2012 |
| TW | 201616763 | 5/2016 |
| TW | I547945 | 9/2016 |

* cited by examiner

*Primary Examiner* — Son T Dinh
(74) *Attorney, Agent, or Firm* — JCIPRNET

(57) ABSTRACT

A computation speed compensation circuit and a compensation method thereof are provided. The computation speed compensation circuit includes a power selection circuit and a computation speed sensor. The power selection circuit selects one of a first power and a second power as a supplied power according to a first control signal. The computation speed sensor detects a response speed of a first detection signal at a first intermediate transmission point of a computation circuit to generate the first control signal. A voltage value of the first power is lower than a voltage value of the second power, and the supplied power is received by a computation circuit as an operation power of the computation circuit.

10 Claims, 5 Drawing Sheets

COMPUTATION SPEED COMPENSATION CIRCUIT AND COMPENSATION METHOD THEREOF

CROSS-REFERENCE TO RELATED APPLICATION

This application claims the priority benefit of Taiwan application serial no. 107116293, filed on May 14, 2018. The entirety of the above-mentioned patent application is hereby incorporated by reference herein and made a part of this specification.

BACKGROUND OF THE INVENTION

1. Field of the Invention

The invention relates to a computation speed compensation circuit and a compensation method of the computation speed compensation circuit, and particularly relates to a computation speed compensation circuit adaptively adjusting the magnitude of an operation power to compensate for computation speed and a compensation method of the computation speed compensation circuit.

2. Description of Related Art

As the manufacturing technologies advance, the size in semiconductor manufacturing is gradually becoming smaller. In the technologies for small-sized manufacturing processes, the influences caused by variation of manufacturing parameters, particularly in the state of a low operation voltage, still cannot be overcome effectively through the conventional worst-case design method. Specifically, in the category of timing violation, how to simply integrate a circuit capable of effectively detecting and correcting run-time into an integrated circuit is now an issue for the artisans of the field to work on.

SUMMARY OF THE INVENTION

One or some exemplary embodiments of the invention provides a computation speed compensation circuit and a compensation method of the computation speed compensation circuit. The circuit and the method are capable of dynamically adjusting the compensation speed, so that a circuit computation operation can be timely completed.

A computation speed compensation circuit according to an embodiment of the invention includes a power selection circuit and a computation speed sensor. The power selection circuit selects one of a first power and a second power as a supplied power according to a first control signal. The computation speed sensor is coupled to a first intermediate signal transmission point of a computation circuit, and detects a response speed of a first detection signal at the first intermediate signal transmission point, so as to generate the first control signal. The supplied power is received by a computation circuit as an operation power of the computation circuit.

A computation speed compensation method according to an embodiment of the invention includes the following. One of a first power and a second power is selected as a supplied power according to a first control signal. A first detection signal at a first intermediate signal transmission point of a computation circuit is detected, and the first control signal is generated according to a response speed of the first detection signal. The voltage value of the first power is lower than the voltage value of the second power, and the computation circuit receives the supplied power as the operation power.

Based on the above, according to the embodiments of the invention, the response speed of the signal at the intermediate signal transmission point of the computation circuit is detected to adjust the computation speed of the computation circuit. The computation speed of the computation circuit can be adaptively adjusted according to the current computation speed of the computation circuit. Accordingly, the computation circuit can effectively generate an effective computation result in a timely manner to prevent the phenomenon of timing violation from occurring.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
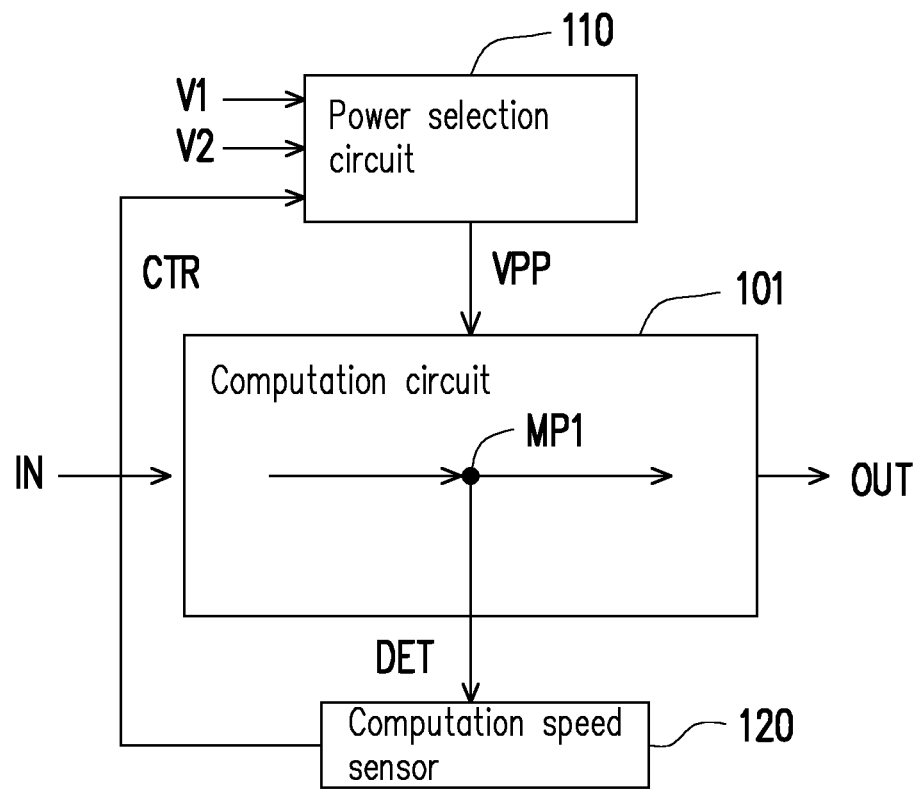
FIG. 1 is a schematic diagram illustrating a computation speed compensation circuit according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, FIG. 1 is a schematic diagram illustrating a computation speed compensation circuit according to an embodiment of the invention. A computation speed compensation circuit 100 includes a power selection circuit 110 and a computation speed sensor 120. The power selection circuit 110 receives a control signal CTR1 and powers V1 and V2. The power selection circuit 110 selects one of the powers V1 and V2 as a supplied power VPP according to the control signal CTR1. The supplied power VPP is provided to a computation circuit 101 and serves as the operation power of the computation circuit 101. The voltage levels of the power V1 and the power V2 are different. In the embodiment, the voltage value of the power V1 may be lower than the voltage value of the power V2. For example, the voltage value of the power V2 may be about 1.1 times of the voltage value of the power V1.

The computation speed sensor 120 is coupled to an intermediate signal transmission point MP1 in the computation circuit 101. In the embodiment, the computation circuit 101 receives an input signal IN and performs computation on the input signal IN. The computation circuit 101 sends out the computation result through an output signal OUT. In the embodiment, the computation circuit 101 may be divided into a first part and a second part, and the first part and the second part are connected through the intermediate signal transmission point MP1. In addition, the computation result generated by the first part is provided to the intermediate signal transmission point MP1, and the second part performs further computation according to the computation result generated by the first part and received by the intermediate signal transmission point MP1.

The computation speed sensor 120 receives a detection signal DET at the intermediate signal transmission point MP1 (i.e., the computation result generated from the first part) and determines a response speed of the detection signal DET. The computation speed sensor 120 generates a control signal CTR1 according to the response speed of the detection signal DET, and transmits the control signal CTR1 to the power selection circuit 110.

Specifically, in the embodiment, the computation speed sensor 120 may provide the control signal CTR to the power selection circuit 110 at the initial time point of the operation of the computation circuit 101, and make the power selection circuit 110 provide the power V1 having a lower voltage value as the supplied power VPP. In this way, the computation circuit 101 may receive the supplied power VPP having a lower voltage as the operation power and carry out a computation operation. The computation circuit 101 may have a lower power consumption.

The computation speed sensor 120 may perform detection on the detection signal DET at the intermediate signal transmission point MP1 and determine the response speed of the detection signal DET according to a transition time point of the detection signal DET. In the embodiment of the invention, the computation speed sensor 120 may determine whether a transition phenomenon of the detection signal DET occurs in a predetermined reference time interval. If the computation speed sensor 120 determines that the transition phenomenon of the detection signal DET occurs in the predetermined reference time interval, the computation speed of the computation circuit 101 is unable to meet the design needs, and the computation speed sensor 120 may generate a corresponding control signal CTR (e.g., at a first logical level). Correspondingly, the power selection circuit 110 may alternatively choose the power V2 as the supplied power VPP according to the control signal CTR1 equal to the first logical level. In this way, the voltage value of the operation voltage (equal to the power V2) received by the computation circuit 101 is increased, and the computation speed of the computation circuit 101 is facilitated.

Comparatively, if the computation speed sensor 120 determines that no transition phenomenon of the detection signal DET occurs in the reference time interval, the computation speed of the computation circuit 101 meets the design needs. The computation speed sensor 120 may maintain the logical level (e.g., a second logical level) of the control signal CTR, and make the power selection circuit 110 maintain the power V1 as the supplied power VPP.

Regarding the transition phenomenon of the detection signal DET, the computation speed sensor 120 may detect the transition phenomenon of the detection signal DET according to the time point at which the detection signal DET is transited from the logical high level to the logical low level or the time point at which the detection signal DET is transited from the logical low level to the logical high level.

It should also be noted that the first logical level and the second logical level are opposite to each other. The first logical level may be 0 (or 1), while the second logical level may be 1 (or 0). The corresponding relation between the logical level of the control signal CTR and the selection operation of the power selection circuit 110 may be determined by the designer, and there is no specific limitation on this regard.

Besides, the reference time point may be designed according to the computation speed of the computation circuit 101 in the typical case. The designer may set the reference time point according to practical needs and the operating state of the computation circuit 101, and there is no specific limitation on this regard, either.

Based on the description above, it can be learned that, in the embodiment of the invention, the magnitude of the voltage value of the operation power received by the computation circuit 101 is adjusted by detecting the response speed of the detection signal DET at the intermediate signal transmission point MP1 of the computation circuit 101. In this way, when the computation speed of the computation circuit 101 meets the needs in the design specification, the computation circuit 101 may be operated with the operation power at a lower voltage and maintain a lower power consumption. Alternatively, when the computation speed of the computation circuit 101 is unable to satisfy the needs in the design specification, the computation speed of the computation circuit 101 can be facilitated by increasing the voltage value of the operation power, so that the computation speed of the computation circuit 101 can meet the needs in the design specification.

Figure 2:
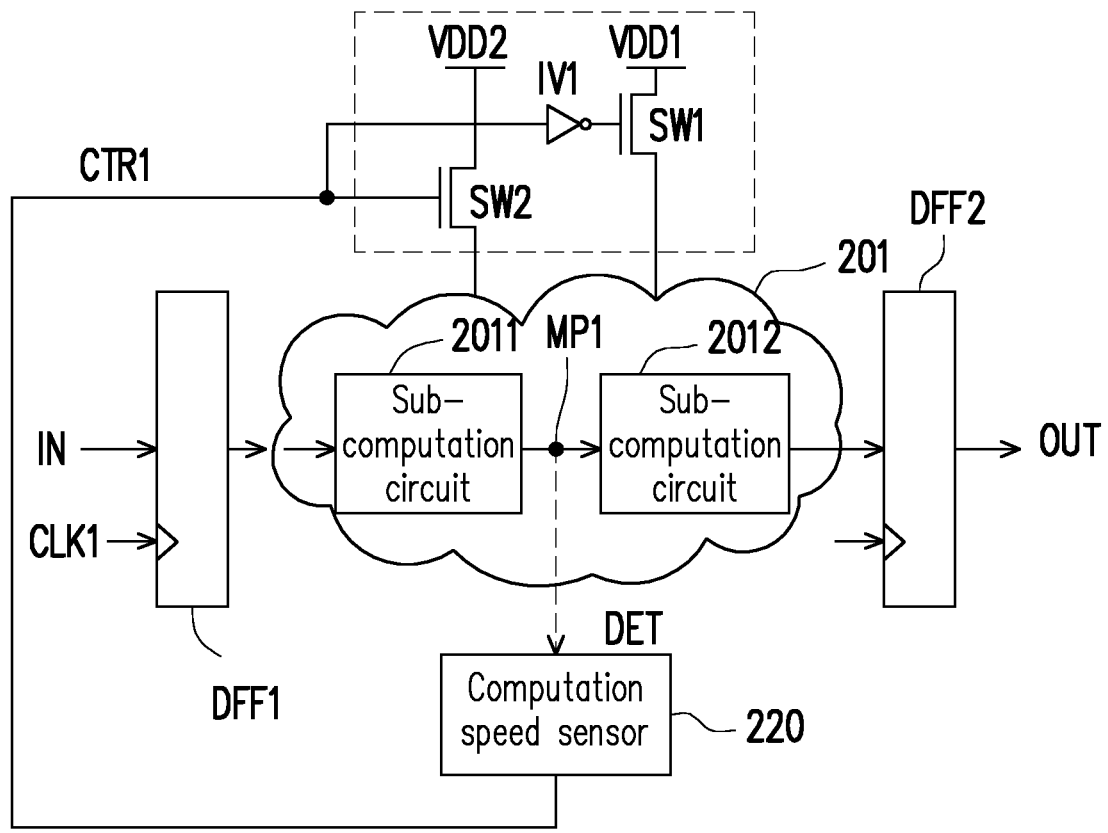
FIG. 2 is a schematic diagram illustrating a computation speed compensation circuit according to another embodiment of the invention.

Referring to FIG. 2, FIG. 2 is a schematic diagram illustrating a computation speed compensation circuit according to another embodiment of the invention. A computation speed compensation circuit 200 includes a power selection circuit 210 and a computation speed sensor 220. The power selection circuit 210 is coupled to the computation circuit 201 and includes a switch SW1 and a switch SW2 formed by transistors. The switch SW1 receives a power VDD1, and is coupled to the computation circuit 201 and turned on or turned off under the control of an inverting signal of the control signal CTR1. The switch SW2 receives a power VDD2, and is coupled to the computation circuit 201, and is turned on or turned off directly under the control of the control signal CTR1. The inverting signal of the control signal CTR1 is generated by an inverter IV1.

In the embodiment of the invention, the switch SW1 and the switch SW2 are formed by transistors of the same type. Therefore, with the switches SW1 and SW2 being controlled by signals inverted with respect to each other, the switches SW1 and SW2 are not turned on at the same time. When the switch SW1 is turned on (the switch SW2 is turned off), the power selection circuit 210 selects to output the power VDD1 as the operation power of the computation circuit 201, and when the switch SW2 is turned on (the switch SW1 is turned off), the power selection circuit 210 selects to output the output power VDD2 as the operation power of the computation circuit 201.

The computation circuit 201 includes a sub-computation circuit 2011 and a sub-computation circuit 2012. The sub-computation circuit 2011 and the sub-computation circuit 2012 are coupled to each other via the intermediate signal transmission point MP1, and the sub-computation circuit 2011, the intermediate signal transmission point MP1, and the sub-computation circuit 2012 are coupled in order between the input end and the output end of the computation circuit 201. In the embodiment of the invention, the output end of the computation circuit 201 is coupled to a flip-flop DFF1, and the output end of the computation circuit 201 is coupled to a flip-flop DFF2. In addition, the flip-flop DFF1 receives the input signal IN, and transmits the output signal IN to the computation circuit 201 according to a transition edge of a clock signal CLK1. The flip-flop DFF2 receives the output generated by the computation circuit 201 and transmits the output of the computation circuit 201 according to a transition edge of a clock signal CLK2, so as to generate the output signal OUT.

The clock signals CLK1 and CLK2 may be the same or different signals. The flip-flop DFF1 and the flip-flop DFF2 may perform operations according to the same transition edges (e.g., positive or negative transition edges) of the clock signals CLK1 and CLK2.

Besides, regarding the operation details of the computation speed sensor 220, the computation speed sensor 220 may compute the time point at which the transition of the detection signal DET occurs through a counting operation (with a built-in counter circuit, not shown), and determine whether the time point at which the transition of the detection signal DET occurs is earlier than the predetermined reference time point by a comparison circuit (not shown), thereby generating the control signal CTR1. The counter circuit and the comparison circuit may be constructed with analog or digital circuits that people having ordinary skills in the art are familiar with, and there is no specific limitation on this regard. Of course, the above description merely serves as an example. People having ordinary skills in the art may also implement the computation speed sensor 220 by resorting to other types of circuit design, and shall not be limited to the counter circuit and the comparison circuit.

Figure 3A:
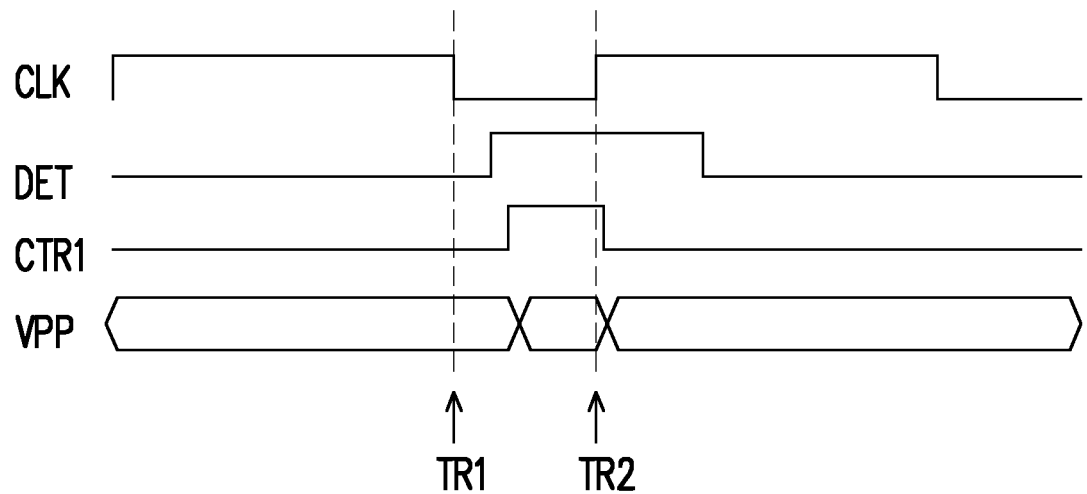
FIGS. 3A and 3B are respectively waveform diagrams of different operations of a computation speed compensation circuit according to an embodiment of the invention.
Figure 3B:
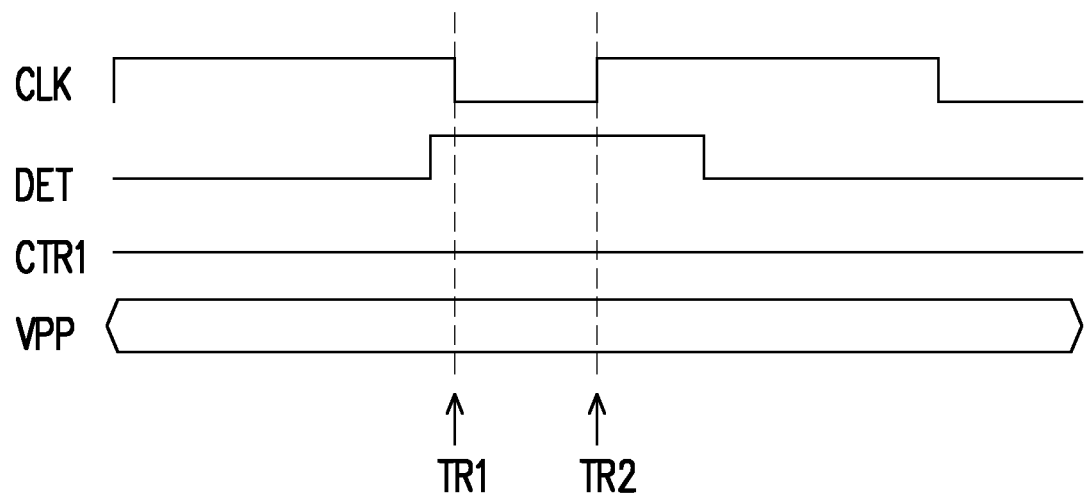

Referring to FIGS. 3A and 3B, FIGS. 3A and 3B are respectively waveform diagrams of different operations of a computation speed compensation circuit according to an embodiment of the invention. In FIG. 3A, the computation speed compensation circuit and the computation circuit in the computation speed compensation circuit are operated according to the clock signal CLK. At the initial time point, the detection signal DET is at the logical low level, and the control signal CTR1 is set at the logical low level. In addition, the supplied power VPP as the operation power of the computation circuit is the power V1 having a lower voltage level.

Through the detection operation of the computation speed sensor, it is found that the transition of the detection signal DET occurs after a reference time point TR1 and before the computation circuit performs computation on the next data (e.g., before a reference time point TR2). Accordingly, the computation speed sensor transits the control signal CTR1 to the logical high level, and makes a voltage selector select the power V2 having a higher voltage value as the supplied power VPP, thereby facilitating the computation speed of the computation circuit. In other words, when the transition of the detection signal DET occurs in the reference time interval between the reference time points TR1 and TR2, the voltage selector may select the power V2 having a higher voltage value as the supplied power VPP, thereby facilitating the operation speed of the computation circuit.

When the clock signal CLK enters the next cycle, the control signal CTR1 is restored to the default logical low level, and the voltage selector is set to select the power V1 having a lower voltage value as the supplied power VPP.

In FIG. 3B, the computation speed compensation circuit and the computation circuit in the computation speed compensation circuit are also operated according to the clock signal CLK. At the initial time point, the detection signal DET is at the logical low level, and the control signal CTR1 is set at the logical low level. In addition, the supplied power VPP as the operation power of the computation circuit is the power V1 having a lower voltage level.

Through the detection operation of the computation speed sensor, it is found that no transition of the detection signal DET occurs after the reference time point TR1 and before the reference time point TR2. Accordingly, the computation speed sensor maintains the control signal CTR1 at the logical low level, and makes the voltage selector maintain the power V1 having a lower voltage value as the supplied power VPP and reduces the power consumption of the computation circuit. In other words, when there is no transition of the detection signal DET in the reference time interval between the reference time points TR1 and TR2, the voltage selector may maintain the voltage value of the supplied power VPP.

Figure 4:
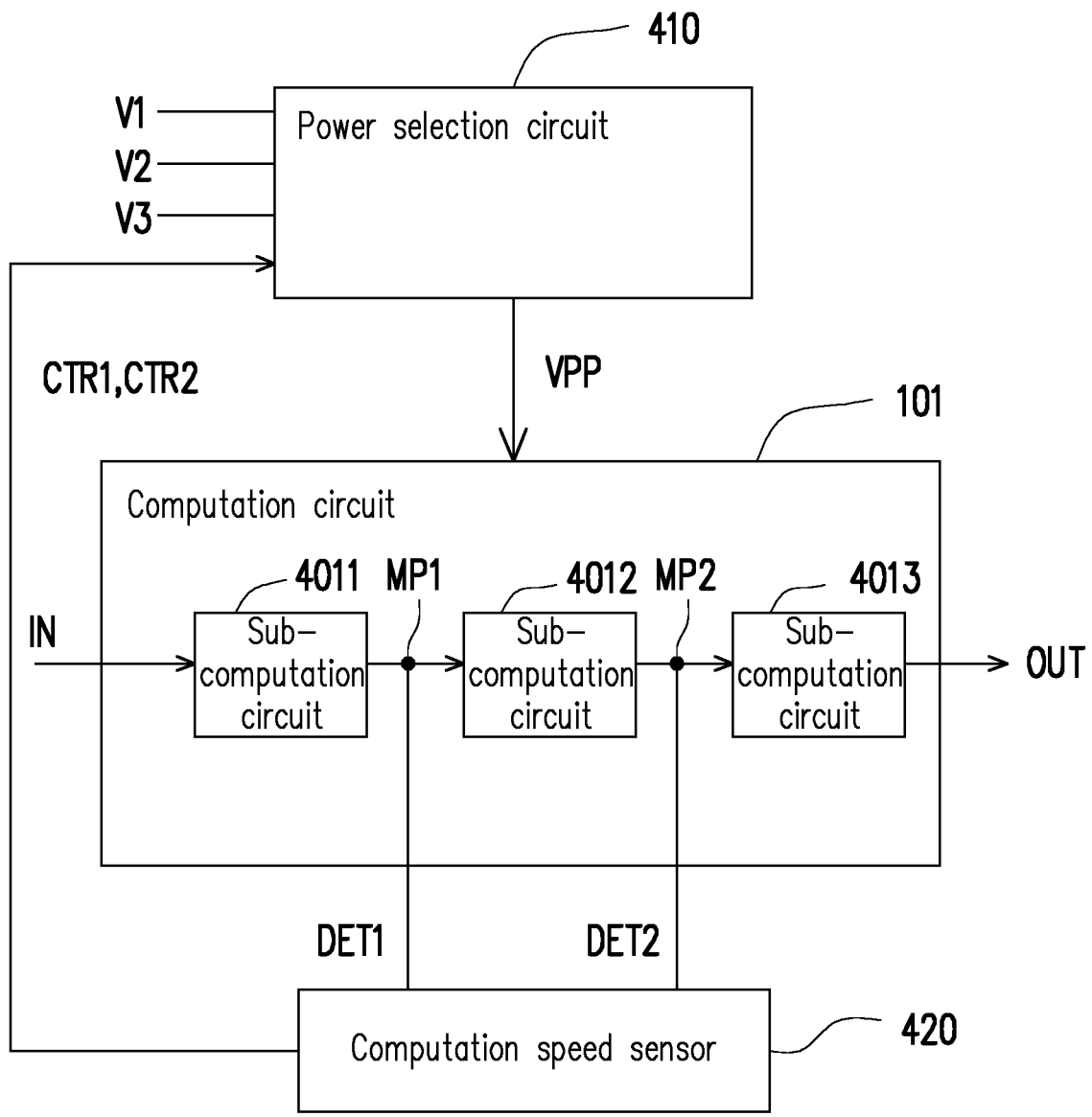
FIG. 4 is a schematic diagram illustrating a computation speed compensation circuit according to yet another embodiment of the invention.

Referring to FIG. 4, FIG. 4 is a schematic diagram illustrating a computation speed compensation circuit according to yet another embodiment of the invention. A computation speed compensation circuit 400 includes a power selection circuit 410 and a computation speed sensor 420. The power selection circuit 410 provides the supplied power VPP as the operation power of the computation circuit 401 according to the control signals CTR1 and CTR2. The computation speed sensor 420 provides the control signals CTR1 and CTR2. What differs from the previous embodiments is that, in the embodiment, the computation circuit 401 is divided into three sub-computation circuits 4011, 4012, and 4013. The sub-computation circuits 4011 and 4012 are coupled to each other via the intermediate signal transmission point MP1, and the sub-computation circuits 4012 and 4013 are connected to each other via an intermediate signal transmission point MP2. In addition, the sub-computation circuit 4011, the intermediate signal transmission point MP1, the sub-computation circuit 4012, the intermediate signal transmission point MP2 and the sub-computation circuit 4013 are coupled in order.

Besides, the computation speed sensor 420 may respectively detect the response speeds of the detection signals DET1 and DET2 at the intermediate signal transmission points MP1 and MP2, and respectively generate the control signals CTR1 and CTR2 according to the response times of the detection signals DET1 and DET2. The power selection circuit 410 may select one of powers V1 to V3 as the supplied power VPP according to the control signals CTR1 and CTR2. In addition, the voltage value of the power V1 is lower than the voltage value of the power V2, and the voltage value of the power V2 is lower than the voltage value of the power V3.

Regarding the implementing details, the computation speed sensor 420 may generate the control signal CTR1 according to the response speed (transition time point) of the detection signal DET1, and make the power selection circuit 410 select the power V2 having a higher voltage value as the operation power of the computation circuit 401 when the response speed of the detection signal DET1 is excessively slow. In addition, the computation speed sensor 420 may further generate the control signal CTR2 according to the response speed (transition time point) of the detection signal DET2, and make the power selection circuit 410 select the power V3 having an even higher voltage value as the operation power of the computation circuit 401 when the response speed of the detection signal DET2 is still not high enough, thereby ensuring the computation speed of the computation circuit 401 satisfies the needs in the design specification.

Details regarding the detecting of the response speeds of the detection signals DET1 and DET2 and the power selection operation of the power selection circuit 410 are already explicated with the foregoing examples and embodiments, and thus will not be repeated in the following.

Based on the above descriptions, in the embodiment of the invention, the response speeds of the detection signals at multiple intermediate signal transmission points in the computation circuit 401 are detected, and a switching operation for multiple stages of the voltage of the operation power is provided to adjust the computation speed of the computation circuit 401, thereby effectively preventing timing violation of the computation circuit from occurring.

Figure 5:
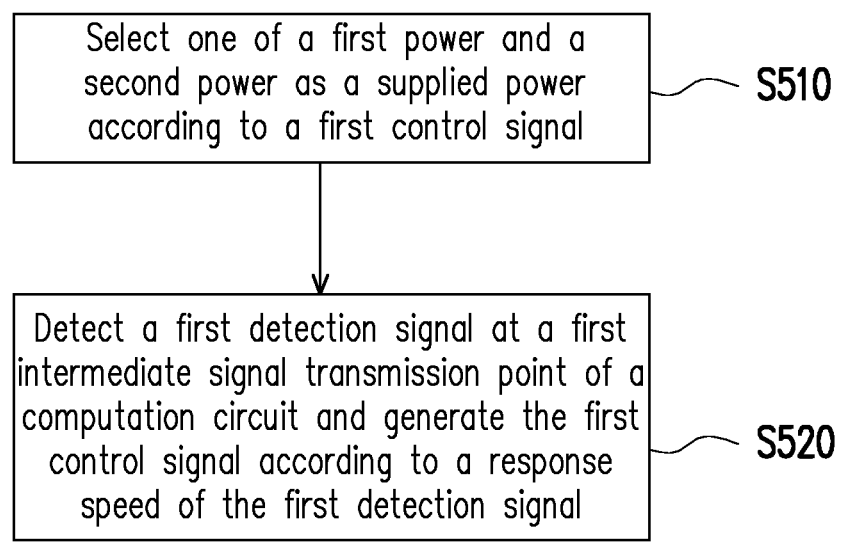
FIG. 5 is a flowchart illustrating a computation speed compensation method according to an embodiment of the invention.

Referring to FIG. 5, FIG. 5 is a flowchart illustrating a computation speed compensation method according to an embodiment of the invention. In FIG. 5, at Step S510, one of a first power and a second power is selected as a supplied power according to a first control signal. In addition, at Step S520, a first detection signal at a first intermediate signal transmission point of a computation circuit is detected, and the first control signal is generated according to a response speed of the first detection signal. A voltage value of the first power is lower than a voltage value of the second power, and the computation circuit receives the supplied power as the operation power.

The implementing details of the above steps are already explicated with the foregoing embodiments, and therefore will not be repeated in the following.

In view of the foregoing, in the embodiments of the invention, the response speed at the intermediate signal transmission point of the computation circuit is detected, and the voltage value of the operation power received by the computation circuit is adjusted according to the response speed of the intermediate signal transmission point. The computation speed of the computation circuit is facilitated by increasing the voltage value of the operation power received by the computation circuit, so as to reduce the chance of occurring of the timing violation. Based on the embodiments of the invention, the designer may design a computation circuit according to the typical case, and the computation circuit can thus be designed more easily.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A computation speed compensation circuit, comprising:
   a power selection circuit, selecting one of a first power and a second power as a supplied power according to a first control signal; and
   a computation speed sensor, coupled to a first intermediate signal transmission point of a computation circuit, and detecting a response speed of a first detection signal at the first intermediate signal transmission point, so as to generate the first control signal,
   wherein the computation circuit receives the supplied power as an operation power.

2. The computation speed compensation circuit as claimed in claim 1, wherein the computation speed sensor determines the response speed of the detection signal according a transition time point of the first detection signal.

3. The computation speed compensation circuit as claimed in claim 2, wherein the computation speed sensor determines whether transition of the first detection signal occurs in a reference time interval as the first control signal.

4. The computation speed compensation circuit as claimed in claim 3, wherein the computation speed sensor generates the first control signal at an initial time point, such that the power selection circuit provides the first power as the supplied power.

5. The computation speed compensation circuit as claimed in claim 4, wherein when the computation speed sensor determines that the transition of the first detection signal occurs in the reference time interval, the computation speed sensor generates the first control signal to make the power selection circuit select the second power as the supplied power; and wherein when the computation speed sensor determines that the transition of the first detection signal does not occur in the reference time interval, the computation speed sensor generates the first control signal to make the power selection circuit maintain the first power as the supplied power.

6. The computation speed compensation circuit as claimed in claim 1, wherein the computation circuit comprises a first sub-computation circuit and a second sub-computation circuit, wherein the first sub-computation circuit, the first intermediate signal transmission point, and the second sub-computation circuit are coupled in order.

7. The computation speed compensation circuit as claimed in claim 1, wherein the computation circuit further comprises:
   a third sub-computation circuit, coupled to the second sub-computation circuit via a second intermediate signal transmission point,
   wherein the computation speed sensor is coupled to the second intermediate signal transmission point and generates a second control signal according to a response speed of a second detection signal at the second intermediate signal transmission point, the power selection circuit further determines whether to select the third power as the supplied power according to the second control signal, wherein a voltage value of the third power is greater than the voltage value of the second power.

8. The computation speed compensation circuit as claimed in claim 1, wherein the power selection circuit comprises:
   a first switch, receiving the first power, coupled to the computation circuit, and controlled by the first control signal; and
   a second switch, receiving the second power, coupled to the computation circuit, and controlled by the first control signal,
   wherein at most one of the first switch and the second switch is turned on.

9. The computation speed compensation circuit as claimed in claim 1, wherein the voltage value of the first power is lower than the voltage value of the second power.

10. A computation speed compensation method, comprising:
    selecting one of a first power and a second power as a supplied power according to a first control signal;
    detecting a first detection signal at a first intermediate signal transmission point of a computation circuit, and generating the first control signal according to a response speed of the first detection signal,
    wherein a voltage value of the first power is lower than a voltage value of the second power, and the computation circuit receives the supplied power as an operation power.

* * * * *